United States Patent
Wiesner et al.

(10) Patent No.: US 10,135,363 B2
(45) Date of Patent: Nov. 20, 2018

(54) COMMUNICATION DEVICE AND SYSTEM

(71) Applicant: FESTO AG & Co. KG, Esslingen (DE)

(72) Inventors: Martin Wiesner, Ostfildern (DE); Steffen Wunderlich, Aichtal (DE)

(73) Assignee: FESTO AG & CO. KG, Esslingen (DE)

( * ) Notice: Subject to any disclaimer, the term of this patent is extended or adjusted under 35 U.S.C. 154(b) by 0 days.

(21) Appl. No.: 15/875,525

(22) Filed: Jan. 19, 2018

(65) Prior Publication Data

US 2018/0212536 A1    Jul. 26, 2018

(30) Foreign Application Priority Data

Jan. 25, 2017  (DE) .......................... 10 2017 201 166

(51) Int. Cl.
*H02M 1/08*     (2006.01)
*H02M 7/5395*   (2006.01)
*H03K 7/08*     (2006.01)
*H02M 1/00*     (2006.01)
*H02M 3/156*    (2006.01)

(52) U.S. Cl.
CPC ......... *H02M 7/5395* (2013.01); *H02M 1/082* (2013.01); *H03K 7/08* (2013.01); *H02M 3/156* (2013.01); *H02M 2001/0009* (2013.01)

(58) Field of Classification Search
CPC ........ H02M 1/082; H02M 1/088; H02M 1/32; H02M 5/539; H02M 5/5395; H02M 2001/0009; H03K 7/00; H03K 7/08
See application file for complete search history.

(56) References Cited

U.S. PATENT DOCUMENTS

| | | | |
|---|---|---|---|
| 2006/0164061 A1* | 7/2006 | Formenti | H02J 7/022 323/371 |
| 2006/0172783 A1* | 8/2006 | Leung | H02M 3/33515 455/572 |
| 2015/0220101 A1* | 8/2015 | Aisa | G05F 3/04 307/31 |

* cited by examiner

*Primary Examiner* — Matthew Nguyen
(74) *Attorney, Agent, or Firm* — Hoffmann & Baron, LLP

(57) ABSTRACT

A communication device for a field device for transferring output information to a controller, including a passive digital output with a first connection point and a second connection point, a circuit arrangement connected between the first connection point and the second connection point, and a control device configured to selectively put the circuit arrangement into one of a plurality of switching states according to the output information to be transferred. The communication device is configured, in a state in which the passive digital output is connected to the controller, to provide an electric output signal with a first signal value according to a first communication protocol at the connection points in a first switching state of the circuit arrangement and to provide the electric output signal with a second signal value according to the first communication protocol at the connection points in a second switching state of the circuit arrangement. The communication device is also configured to provide the electric output signal with a signal value according to a second communication protocol at the connection points in a third switching state of the circuit arrangement.

10 Claims, 1 Drawing Sheet

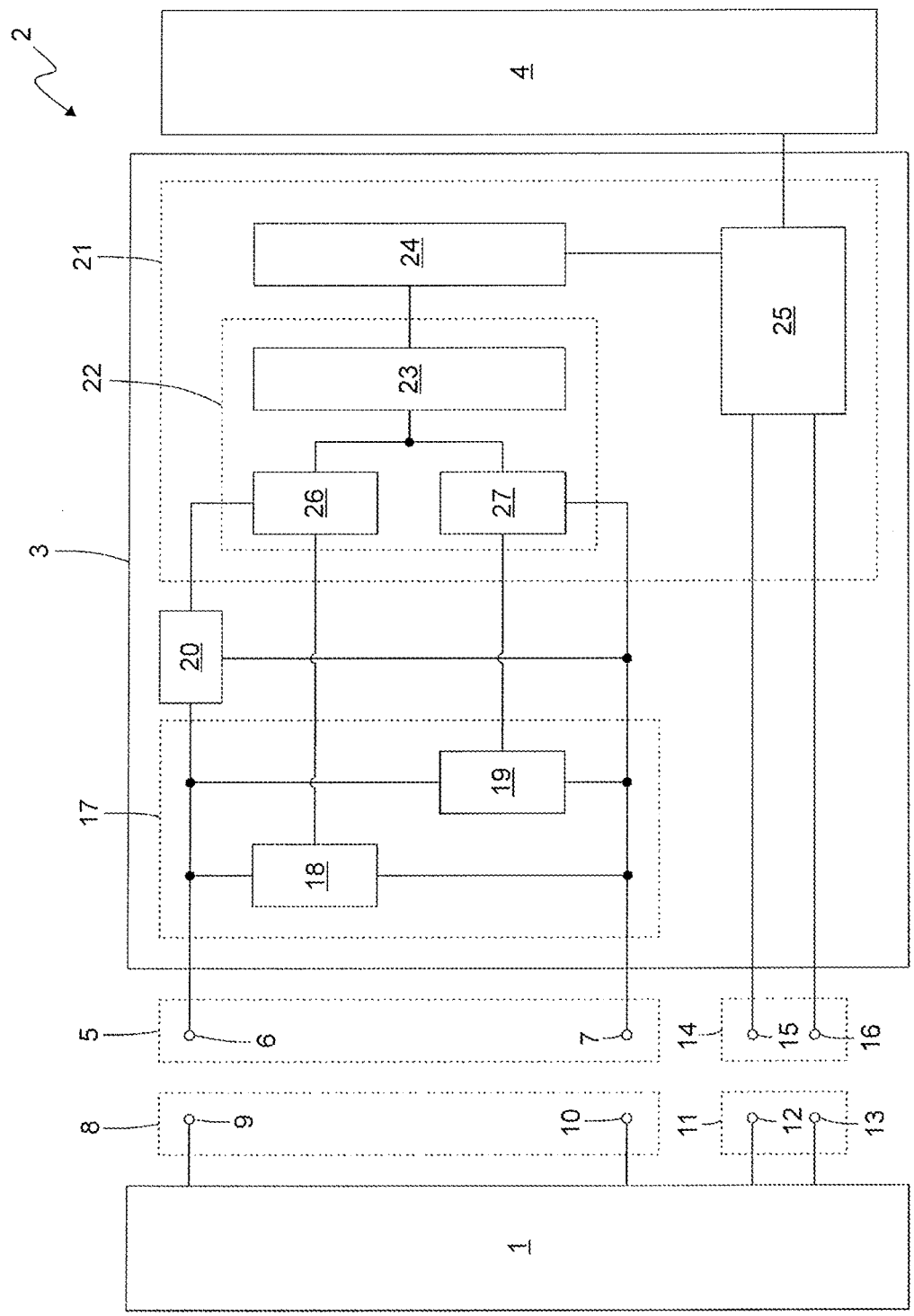

COMMUNICATION DEVICE AND SYSTEM

BACKGROUND OF THE INVENTION

The invention relates to a communication device for a field device for transferring output information to a controller, the communication device comprising a passive digital output with a first connection point and a second connection point, a circuit arrangement, which is connected between the first connection point and the second connection point, as well as a control device which is configured to selectively put the circuit arrangement into one of a plurality of switching states according to the output information to be transferred, wherein the communication device is configured to provide, in a state in which the passive digital output is connected to the controller, an electric output signal with a first signal value according to a first communication protocol at the connection points in a first switching state of the circuit arrangement and to provide the electric output signal with a second signal value according to the first communication protocol at the connection points in a second switching state of the circuit arrangement.

The mentioned communication device is used to transfer information from a field device to a controller, for example a superordinate controller, in particular a PLC or SPS. The information transferred from the field device to the controller shall also be denoted as output information. The output information may, for example, be a status confirmation from the field device to the controller.

The field device can typically expend only very little or no energy for the transfer of this output information. This is, for example, due to the fact that the output, at which the output information is provided, is to be used in an explosion-proof region in which the electric power used may not exceed certain threshold values and, for this reason, an actually available energy supply of the field device may not be used or may be used only to a limited extent for this output.

The output for the transfer of the output information is thus configured as a passive output. This means in particular that the energy, by means of which the electric output signal is provided, does not originate from the communication device, but instead from the controller.

For example, the controller has a voltage source, which is connected to the passive output during the transfer of the output information. Depending on the output information to be transferred, the circuit arrangement of the communication device is put into a certain switching state, whereby this causes an electric signal with a certain signal value, for example an electric current with a certain current strength to be set at the passive output. The controller is in turn configured to detect this current strength and to determine the transferred output information therefrom.

The switching state of the circuit arrangement thus serves to set the signal value of the electric output signal. The circuit arrangement has a plurality of switching states, consequently a plurality of signal values can be provided. The signal values are value-discrete such that the output for transferring the output information is a digital output.

The signal values are defined according to a first communication protocol. For example, a plurality of valid current strengths, voltages and/or current-voltage value pairs are defined as signal values by the first communication protocol. The controller, to which the output information should be transferred, is configured according to a communication protocol; i.e., the controller is configured to detect signal values of the electric output signal, the signal values being defined by the communication protocol, and to convert these according to the communication protocol into the output information.

There are different communication protocols, which differ in at least one defined signal value. For example, for communication with a controller configured as a PCL or SPS, a different communication protocol is prescribed than for communication with an NAMUR controller (NAMUR=User Association of Automation Technology in Process Industries).

Compatibility with a plurality of communication protocols is conventionally ensured by a communication device being equipped with a plurality of passive digital outputs, wherein a separate passive digital output is provided for each communication protocol.

SUMMARY OF THE INVENTION

An object of the invention is to efficiently modify the communication device mentioned in the introduction such that it can be used in a more versatile manner.

The object is achieved for the communication device mentioned in the introduction by the features indicated in the characterising part of claim 1. According to the invention, the communication device is further configured to provide the electric output signal with a signal value according to a second communication protocol at the connection points in a third switching state of the circuit arrangement.

The communication device is therefore capable of providing signal values according to different communication protocols. Consequently, the communication device can communicate according to different communication protocols and thus can be used in cooperation with different controllers. The communication device according to the invention can, in particular, be used not only in cooperation with a controller, which supports the first communication protocol, but also with a controller, which supports the second communication protocol. The communication device according to the invention can thus be used in a versatile manner.

Unlike the previously-mentioned conventional approach, in which a separate passive digital output is provided for each communication protocol to be supported, the communication according to both communication protocols takes place at one and the same passive digital output in the approach according to the invention. One and the same connection points are in particular used in order to provide signal values according to different communication protocols. Additional passive digital outputs are thus not required in order to achieve the previously-mentioned, more versatile usability. For this reason, more versatile usability is achieved in an efficient manner.

Advantageous configurations of the invention are the subject matter of the dependent claims.

According to one configuration, the signal value that can be provided in the first switching state of the circuit arrangement corresponds to a low level according to the first communication protocol and/or to a low level according to the second communication protocol. The signal value that can be provided in the second switching state of the circuit arrangement expediently corresponds to a high level according to the first communication protocol. The signal value that can be provided in the third switching state of the circuit arrangement preferably corresponds to a high level according to the second communication protocol. It is thereby possible to provide a high level according to two different communication protocols at one and the same digital passive output.

According to a further configuration, the circuit arrangement has a plurality of switchable electronic loads. The electronic loads are expediently connected in parallel with respect to each other between the first connection point and the second connection point. By means of the switchable electronic loads connected in parallel, a circuit arrangement can be efficiently provided, which can adopt at least three different switching states, by means of which at least three different signal values can be provided at the connection points of the passive digital output.

According to a further configuration, the control device is configured to provide a scalar control signal, which sets both the output information to be transferred and the communication protocol to be used. Consequently, only one single scalar control signal is required for setting the output information to be transferred and for the communication protocol to be used.

According to a further configuration, the control device has an isolating transmitter, which provides galvanic isolation inside the control device. The control device is preferably configured to transfer the scalar control signal with the aid of the isolating transmitter across the galvanic isolation. The galvanic isolation fulfils the purpose of certain electric limit values, for example with respect to an explosion safety standard that must be met, being adhered to for the passive digital output, independently of other components of the field device. If, as previously mentioned, one and the same scalar control signal is used for the selection of the output information and the communication protocol, then only one signal has to be transferred via the galvanic isolation. As a result, the structure of the communication device can be designed in a particularly compact manner.

According to a further configuration, the control device is configured to provide the scalar control signal as a PWM signal. A PWM signal is particularly well-suited for the transfer with an isolating transmitter.

According to a further configuration, the control device is configured to switch the isolating transmitter on and off according to the PWM signal. The isolating transmitter is in particular connected such that the isolating transmitter is switched on only at the time of the transfer of the edges of the PWM signal. The isolating transmitter is thereby operated in a particularly energy-efficient manner.

According to a further configuration, the control device has a comparator arrangement which is configured to provide a first and a second actuation signal for the circuit arrangement based on the scalar control signal. By providing a comparator arrangement, the actuation signal required for actuating the circuit arrangement can be generated easily and efficiently.

According to a further configuration, the comparator arrangement has a low pass filter. Using the low pass filter, the actuation signal preferably configured as a PWM signal can be filtered, before it is supplied to comparators of the comparator arrangement.

Furthermore, a system is provided, comprising a controller with an active digital input and a field device with a previously-discussed communication device according to the invention, wherein the active digital input is connected to the passive digital output.

BRIEF DESCRIPTION OF THE DRAWINGS

An exemplary embodiment of the invention is explained below with reference to the drawing.

FIG. 1 shows a schematic block diagram of a system with a controller and a field device.

DETAILED DESCRIPTION

FIG. 1 shows a system with a controller 1 and a field device 2. The field device 2 has a communication device 3 and an actuator and/or sensor device 4. The controller 1 and the actuator and/or sensor device 4 shall illustrate a typical exemplary application of the communication device 3.

The communication device 3 serves to transfer output information to the controller 1. To this end, the communication device 3 has a passive digital output 5 with a first connection point 6 and a second connection point 7.

The communication device 3 further has a circuit arrangement 17, which is connected between the first connection point 6 and the second connection point 7. The communication device 3 further has a control device 21 which is configured to selectively put the circuit arrangement 17 into one of a plurality of switching states according to output information to be transferred.

In FIG. 1, the communication device 3 is shown in a state in which it is not connected to the controller 1. In actual operation, the communication device 3 is in a state, in which the passive digital output 5 is connected with a controller, for example the controller 1. In this state, a voltage is applied at the connection points 6, 7 of the passive digital output 5.

The communication device 3 is configured to provide, in this state, i.e. when the passive digital output 5 is connected to the controller 1, an electric output signal with a first signal value according to a first communication protocol at the connection points 6 and 7, when the circuit arrangement 17 is in a first switching state. The communication device 3 is further configured to provide the electric output signal with a second signal value according to the first communication protocol at the connection points 6 and 7 when the circuit arrangement 17 is in a second switching state.

The communication device 3 is further configured to provide, in the state in which the passive digital output 5 is connected to the controller 1, the electric output signal with a signal value according to a second communication protocol at the connection points 6 and 7 when the circuit arrangement 17 is in a third switching state.

The three switching states are expediently different switching states. The three mentioned signal values, the first and the second signal value according to the first communication protocol and the signal value according to the second communication protocol, are also expediently distinguished from each other.

The communication device 3 is thus configured to provide both signal values according to the first communication protocol and also at least one signal value according to the second communication protocol at the same connection points 6 and 7. The communication device 3 can thus be used in a versatile manner since it can communicate both with controllers, which support the first communication protocol and also with controllers, which support the second communication protocol. The versatile usability is efficiently achieved since only one single passive digital output 5 is required. The communication device 3 and/or the field device 2 expediently only has one single passive digital output.

Exemplary configurations of individual components are explained below.

The field device 2 may be a field device used in process automation. It may, in particular, be a positioner, control head and/or a position controller, in particular to control and/or regulate a valve, for example a process valve.

The field device 2 is for example configured as a two-wire field device, preferably as a two-wire position controller. This means that the control and the energy supply take place via the same two wires. In the example shown, the field device 2 has a field device input 14 with the two connection points 15 and 16. The control and/or energy supply of the field device 2 can for example take place via the field device input 14.

The control and/or energy supply of field device 2 can be carried out by the controller 1. The controller 1 has, for example, a controller output 11 with the two connection points 12 and 13. These can be connected during operation to the two connection points 15 and 16 of the field device input 14. The controller 1 can be configured to provide actuation commands and/or energy via the controller output 11 to the field device 2. The controller output 11 and the field device input 14 together preferably form a current interface, for example a 4-20 mA current interface.

The field device input 14 is, for example, connected to the control device 21. In the example shown, the control device 21 has a control unit 25, which is communicatively connected to the field device input 14. The control unit 25 can, for example, comprise a microcontroller. The control device 21, in particular the control unit 25, receives the control commands provided by the controller 1. The control device 21, in particular the control unit 25, can further be configured to use the electric energy provided by the controller 1 as an energy supply.

The field device 2 has, for example, the actuator and/or sensor device 4. The actuator and/or sensor device 4 can, for example, have a drive, preferably a pneumatic and/or electric drive, in particular a drive for activating a valve member. Additionally or alternatively, the actuator and/or sensor device 4 can have a sensor, for example a position sensor, preferably for detecting the position of a valve member, and/or a pressure sensor.

The control device 21, in particular the control unit 25, is configured to communicate with the actuator and/or sensor device 4, for example in order to control them or to receive feedback and/or sensor signals from them. The communication between the control device 21 and the actuator and/or control device 4 can, in particular take place via analogue and/or digital signals.

The control device 21, in particular the control unit 25, is further configured to provide output information to be transferred to the controller 1. The output information is for example a bit or a sequence of bits. The output information can, for example, be based on a state of the actuator and/or sensor device 4 and/or the control device 21.

The control device 21 is configured to control the circuit arrangement 17 according to the output information to be transferred. The control device 21 is, in particular, configured to put the circuit arrangement 17 into one of a plurality of switching states, depending on the output information to be transferred, e.g. depending on the bit to be transferred and on the communication protocol to be used.

The control device 21, in particular the control unit 25, preferably has a configuration function by means of which it is possible to set which communication protocol is supposed to be used. The configuration function can, for example, be configured as a software function. In this case, a hardware configuration, for example by means of jumpers and/or wire bridges is not required in order to set the communication protocol to be used.

For example, the control device 21 is configured to provide a scalar control signal, which sets both the output information to be transferred and the communication protocol to be used; that is, to the scalar control signal, information is mapped with respect to what shall be transferred as output information, for example, which bit value, and, in addition thereto, information regarding which communication protocol shall be used. A signal, which has only one component or one scalar value as the signal value, shall be denoted as a scalar control signal.

The control device 21, in particular the control unit 25, is preferably configured to map different, preferably all combinations of the output information to be transferred, for example the bit value to be transferred, and the communication protocol to be used, on different signal values of the scalar control signal.

If, for example there are two different communication protocols and two different items of output information, e.g. bit value 1 and bit value 0, then four possible combinations of communication protocol and output information emerge. Accordingly, the control device 21, in particular the control unit 25, can be configured to selectively provide the scalar control signal with one of four different possible signal values.

It may occur that for different communication protocols the signal value for certain output information, for example the bit value 0, is defined to be the same. In this case, the number of different signal values of the scalar control signal, which can be provided by the control device 21 or the control unit 25, can also be lower than the number of combinations that emerge from the number of communication protocols and the number of items of output information.

In the previously-mentioned example, the control device 21 or the control unit 25 can, for example also be configured to provide the scalar control signal only with three different possible signal values when for example the signal value of the output information "bit value=0" is defined to be the same for both communication protocols.

The control device 21, in particular the control unit 25, is configured to provide the scalar control signal with a signal value, which constitutes a determined combination of communication protocol and output information. The scalar control signal is preferably an AC signal, in particular a pulse-width modulation signal (PWM signal), in which the signal value is represented by the duty cycle or the ratio of a pulse to a period. The AC signal can, in particular have an alternating current signal and/or an alternating voltage signal. The control device 21 is expediently configured to provide the scalar control signal as a PWM signal.

The control device 21 has, for example, an isolating transmitter 24, which provides galvanic isolation inside the control device 21. The control device 21 is expediently configured to transfer the scalar control signal with the aid of the isolating transmitter 24 across the galvanic isolation.

By means of the isolating transmitter 24, the passive digital output 5 shall, in particular, be galvanically isolated from the control unit 25, the actuator and/or sensor device 4 and/or the field device input 14. The purpose of this is, for example, that the passive digital output 5 is supposed to fulfil a determined explosion safety standard, that is, that it should be ensured that the electric current occurring in the region of the passive digital output 5 is low enough so that no spark formation can occur.

The scalar control signal can be transferred across the galvanic isolation by means of the isolating transmitter 24. The previously-mentioned formation of the scalar control signal as an AC signal, in particular as a PWM signal, is particularly advantageous in this context since it allows the usage of isolating transmitters which cannot transfer DC signals. In particular, an isolating transmitter may be used in which the transfer takes place via a transformer.

Expediently, only one signal in total, namely the scalar control signal discussed, is transferred across the galvanic isolation, i.e. the isolating transmitter 24, in order to control the circuit arrangement 17. As a result, the galvanic isolation or the isolating transmitter 24 can be configured in a particularly compact and space-saving manner.

The control device 21 can preferably be configured to switch the isolating transmitter 24 on and off according to the scalar control signal configured as a PWM signal. The control device 21 can, in particular, be configured to switch on the isolating transmitter prior to each edge of the PWM signal and switch off said isolating transmitter after each edge of the PWM signal. The isolating transmitter 24 is thus switched on only at the time of the transfer of the edges of the PWM signal. An energy-efficient operation of the isolating transmitter 24 is thereby achieved.

For example, the control device 21 has a comparator arrangement 22 which is configured to provide a first and a second actuation signal for the circuit arrangement 17 based on the scalar control signal.

The comparator arrangement 22 is, for example, configured to initially convert the scalar control signal into a DC signal and to then generate the actuation signals based on this DC signal. The DC signal can, in particular, comprise a direct current signal and/or a direct voltage signal.

In the example shown, the comparator arrangement 22 has a low pass filter 23, into which the scalar control signal is input. The low pass filter 23 is configured to filter the scalar control signal such that it is present as a DC signal, in which the signal value is represented by the amplitude.

The comparator arrangement 22 may, for example, further comprise the comparators 26 and 27. The number of comparators may depend on the number of signal values which are transferred with the scalar control signal and/or the number of switching states, which the comparator arrangement shall adopt. In the example shown, the comparator arrangement 22 has two comparators 26 and 27, since at most three different signal values shall be transferred by the scalar control signal, and the circuit arrangement 17 is supposed to adopt at most three different switching states. If more than three signal values for the scalar control signal or more than three switching states are provided, the comparator arrangement 22 can also be equipped with more than two comparators.

The scalar control signal present as a DC signal is supplied to the comparators 26, 27. It should be pointed out in this connection that, provided no galvanic isolation or isolating transmitter 24 is provided, the scalar control signal can also be present from the start as a DC signal, it can thus for example already be generated by the control unit 25 as a DC signal.

The comparator arrangement 22 is configured to provide a plurality of threshold values. The number of threshold values is expediently one less than the number of signal values of the scalar control signal and/or the number of the switching states of the circuit arrangement 17. In the case discussed, in which three signal values or three switching states are required, the comparator arrangement 22 provides two threshold values. The threshold values are preferably derived from the voltage applied at the connection points 6, 7. For this purpose, the comparator arrangement 22 has, for example a plurality of voltage dividers.

One threshold value is assigned to each of the comparators 26, 27. The threshold values differ from each other. Each of the comparators 26, 27 is configured to compare the scalar control signal present as a DC signal with the assigned threshold value and, based on this comparison, to provide an actuation signal.

The circuit arrangement 17 is then actuated with the actuation signals such that it adopts a certain switching state.

By means of the previously discussed exemplary configuration, the control device 21 fulfils its function of providing a scalar control signal via which the switching state of the circuit arrangement 17 is set.

The communication device 3 has, for example a voltage supply 20. Said voltage supply is configured to provide a supply voltage for the comparator arrangement 22, in particular for operational amplifiers expediently used there, based on the voltage applied at the connection points 6 and 7.

The circuit arrangement 17 is, as already mentioned above, put into different switching states by means of actuation by the control device 21. Each switching state corresponds to a combination of a selected communication protocol and piece of output information to be transferred.

Expediently, in each switching state or in at least three switching states of the circuit arrangement 17, a different current-voltage characteristic curve emerges between the connection points 6 and 7A, such that, by means of applying a current and/or a voltage at the connection points 6, 7 and detecting a resulting current and/or a voltage at the connection points 6, 7, a conclusion can be made concerning the switching state of the circuit arrangement 17 or the output information represented thereby. For example, a different impedance emerges in each switching state or in at least three switching states of the circuit arrangement 17 between the connection points 6 and 7.

The circuit arrangement 17 preferably has a plurality of switchable electronic loads 18, 19 to provide the different switching states. The switchable electronic loads 18, 19 are, for example connected in parallel to each other between the first connection point 6 and the second connection point.

The number of required switchable electronic loads 18, 19 depends on the number of switching states of the circuit arrangement 17. Each electronic load 18, 19 can, for example adopt two different states. In the case previously discussed, in which the circuit arrangement 17 is supposed to provide three different switching states, two electronic loads 18, 19 are thus required.

The switchable electronic loads 18, 19 are expediently configured such that they can be selectively put into one of the two different states by actuation from the control device 21, for example by the two actuation signals provided by the comparator arrangement 22. Each electronic load 18, 19 is expediently actuated by a respective actuation signal.

Each electronic load 18, 19 preferably has an on-state and an off-state. Each electronic load 18, 19 expediently adopts in the off-state a high-impedance state, in which no current or virtually no current flows through the electronic load. The switchable electronic loads 18, 19 expediently have, in each switching state, a different impedance and/or current-voltage characteristic curve.

The electronic loads 18, 19 can, for example be a unit or an assembly, which provides a determined impedance and thus can, for example, constitute a replacement for a conventional load resistance. Expediently, each of the switchable electronic loads 18, 19 is an electronic load 18, 19 with a switch. Each of the electronic loads 18, 19 is expediently a passive circuit.

The switchable electronic loads 18, 19 can, in particular, be configured as switchable current sinks, preferably as switchable constant current sinks. A current sink is in particular a unit or an assembly, which, when a voltage is applied, sets the current flowing through the current sink to a determined current strength, in particular regulates it to a determined current strength.

In this case, the switchable electronic load 18, 19 configured as a switchable current sink causes, in the on-state, a current to flow through the electronic load 18, 19 with a predetermined current strength, provided a voltage is applied at the connection points 6, 7.

Switchable electronic loads, in particular those which are configured as switchable current sinks, are known from the prior art.

All switchable electronic loads 18, 19 of the circuit arrangement 17 are expediently configured as switchable current sinks, in particular as switchable constant current sinks.

Through the parallel connection of the electronic loads 18, 19 configured as current sinks, a resulting overall load current emerges at the connection points 6, 7, whose current strength substantially corresponds to the total of the current strengths set by each electronic load 18, 19. If additional components are supplied by the voltage applied at the passive digital output 5, such as for example the voltage supply 20 represented in FIG. 1, the overall load current can additionally comprise the current flowing through the additional components.

In the case of the described parallel circuit of the switchable electronic loads 18, 19, each switchable electronic load 18, 19 thus provides an additional current path, which expediently can be selectively switched on or off by switching the corresponding electronic load 18, 19.

The overall load current flowing through the connection points 6 and 7 is determined by the switching states of the switchable electronic loads 18, 19.

Depending on the switching state of the circuit arrangement 17, an electric signal with a different signal value can thus be read at the connection points 6 and 7. Preferably, the signal value of the electric signal is the current strength, the voltage or a combination of current strength and voltage of the electric signal.

The signal value corresponds to the selected communication protocol, in the previously-explained example to a first or a second communication protocol.

For example, the first signal value providable in the first switching state of the circuit arrangement 17 corresponds to a low level according to the first communication protocol. For example, the circuit arrangement 17 can, in the first switching state, adopt a high-impedance state in which e.g. all electronic loads 18, 19 are switched to a high-impedance state. In this case, no current or virtually no current flows through the connection points 6, 7, in any case, the current flowing in this case is below a predetermined threshold value. The resulting current strength and/or the voltage between the connection points 6, 7 is the provided first signal value. The first signal value providable in the first switching state expediently also corresponds to a low level according to the second communication protocol.

Furthermore, the second signal value providable in the second switching state of the circuit arrangement 17 may correspond to a high level according to the first communication protocol. The circuit arrangement 17 may, for example, adopt a state in the second switching state in which not all electronic loads 18, 19 are switched to a high-impedance state such that a current flows at least through one of the electronic loads 18, 19. At least one of the electronic loads 18, 19 configured as constant current sinks can, for example be in the on-state such that a current is provided with a predetermined current strength. The electronic load 18 can, for example be in the on-state, while the electronic load 19 is in the off-state. The current strength of the current flowing through the connection points 6, 7 and/or the resulting voltage between the connection points 6, 7 is then the provided second signal value according to the first communication protocol.

Furthermore, the signal value providable in the third switching state of the circuit arrangement 17 may correspond to a high level according to the second communication protocol. The circuit arrangement 17 can, for example, adopt a state in the third switching state in which not all or none of the electronic loads 18, 19 are switched to a high-impedance state such that a current flows at least through one of the electronic loads 18, 19 or through all electronic loads 18, 19. At least one of the electronic loads 18, 19 configured as constant current sinks can, for example be in the on-state such that a current is provided with a predetermined current strength. The electronic load 19 can, for example be in the on-state. In addition to this, an additional electronic load configured as a constant current sink, for example the electronic load 18 can also be in the on-state. The current flowing through the connection points 6, 7 then comprises the total of the currents flowing through the individual electronic loads in the on-state. Alternatively, only the electronic load 19 can be in the on-state, for example, while the electronic load 18 is in the off-state. The current strength of the current flowing through the connection points 6, 7 and/or the resulting voltage between the connection points 6, 7 is the provided signal value according to the second communication protocol.

This signal value expediently differs from the first signal value and the second signal value according to the first communication protocol.

In the example shown, the controller 1 has an active digital input 8, which is connected during operation to the passive digital output 5. The active digital input 8 comprises the connection points 9, 10 which are connected at the connection points 6, 7 during operation.

The controller 1 is expediently configured to provide a predetermined voltage between the connection points 9, 10, for example 24 V.

The controller 1 is configured to detect the signal value of the electric output signal provided at the passive digital output 5 and convert it into the output information to be transferred according to the first or the second communication protocol.

The first communication protocol and/or the second communication protocol may, for example be an NAMUR standard and/or an SPS or PLC standard.

The controller 1 can, accordingly, be configured as an SPS or PLC or as an NAMUR controller. A NAMUR controller should be understood, in this context, as a controller which is configured to detect and correctly interpret electric signals or signal values provided, which correspond to an NAMUR standard, from an NAMUR output, for example an NAMUR sensor. An SPS or PLC should be understood as a controller which is configured to detect and correctly interpret signal values which correspond to an SPS or PLC standard.

The previously-explained communication device 3 or the previously-explained field device 2 can, in particular, be used in process automation.

In process automation, passive digital outputs, such as the passive digital output 5 are required for control tasks with field devices, such as the field device 2. There are different standards for digital outputs which are defined by conventions or recommendations. For example, Namur, SPS or PLC, proximity switch, etc. Accordingly, there may be different electric requirements for digital outputs, i.e. those which do not provide energy with regard to their impedance properties (for example resistance, current sink etc.). Behavior as an SPS or PLC or behavior as a NAMUR-compatible output (for example behavior as a proximity switch) may be required, for example, in the case of a particular application.

Different outputs and connection possibilities are normally made available for different requirements on such outputs. However, these are often times not used at the same time, but rather the customer decides depending on the application and field of use which type of output they would like to use.

The digital passive outputs (electric circuits), like the passive digital output 5, are in particular those which are supposed to be used in the explosion-protected area. A galvanic isolation, which is not prone to interference, like the galvanic isolation previously discussed, is, inter alia, also characteristic here. A galvanic isolation can be quite substantial in terms of space requirement (required air and creepage distances) and price. These isolations are normally required in the number of outputs and for this reason are in particular intensive in terms of space and cost.

The different outputs can also be configured so as to be electronically switchable, in particular when they are not required at the same time, as is the case with the previously-discussed communication device 3. For example, such an output, like the previously-discussed passive digital output 5, can selectively behave as an NAMUR output, as an SPS or PLC schützoutput or as a safety circuit or protective controller (EDM, external device monitoring) in a safety-related application (potential-free contact to confirm functional safety).

As already explained above, this switchover does not have to necessarily take place via an additional channel. The switchover expediently takes place via the same control channel, which also sets the logic state of the passive digital output. In the previously-discussed exemplary embodiment, this control channel is provided by the scalar control signal. The switchover of the passive digital output 5 expediently takes place only depending on the scalar control signal, which runs across the galvanic isolation.

The scalar control signal may, as already discussed above, be a PWM signal, for example. The pulse-pause ratio controls the impedance or property of the passive digital output 5.

Different possible signal values of a PWM signal are represented below as an example, assigned to a possible resulting state of a passive digital output. The signal values and states do not necessarily have to be understood in conjunction with the exemplary embodiment shown in FIG. 1; they may in particular also be signal values and states of a communication device, which has more than two comparators.

| Pulse-pause ratio | State of the output |
|---|---|
| 10% | Impedance 1 (e.g. high-impedance) |
| 25% | Impedance 2 (e.g. behaviour as current sink with a predetermined current strength, e.g. in the mA range) |
| 50% | Behaviour as ohmic resistance with a predetermined resistance value |
| 75% | Impedance 4 |

What is claimed is:

1. A communication device for a field device for transferring output information to a controller, the communication device comprising:
a passive digital output with a first connection point and a second connection point;
a circuit arrangement connected between the first connection point and the second connection point; and
a control device configured to selectively put the circuit arrangement into one of a plurality of switching states according to the output information to be transferred,
wherein the communication device is configured to provide, in a state in which the passive digital output is connected to the controller, an electric output signal with a first signal value according to a first communication protocol at the connection points in a first switching state of the circuit arrangement and to provide the electric output signal with a second signal value according to the first communication protocol at the connection points in a second switching state of the circuit arrangement, and
wherein the communication device is further configured to provide the electric output signal with a signal value according to a second communication protocol at the connection points in a third switching state of the circuit arrangement.

2. The communication device according to claim 1, wherein the first signal value providable in the first switching state of the circuit arrangement corresponds to a low level according to the first communication protocol, the second signal value providable in the second switching state of circuit arrangement corresponds to a high level according to the first communication protocol and the signal value providable in the third switching state of the circuit arrangement corresponds to a high level according to the second communication protocol.

3. The communication device according to claim 1, wherein the circuit arrangement has a plurality of switchable electronic loads, which are connected in parallel to each other between the first connection point and the second connection point.

4. The communication device according to claim 1, wherein the control device is configured to provide a scalar control signal which determines both the output information to be transferred and the communication protocol to be used.

5. The communication device according to claim 4, wherein the control device has an isolating transmitter which provides a galvanic isolation inside the control device, and wherein the control device is configured to transfer the scalar control signal with the aid of the isolating transmitter across the galvanic isolation.

6. The communication device according to claim 4, wherein the control device is configured to provide the scalar control signal as a PWM signal.

7. The communication device according to claim 6, wherein the control device has an isolating transmitter which provides a galvanic isolation inside the control device, and wherein the control device is configured to transfer the scalar control signal with the aid of the isolating transmitter across the galvanic isolation, and wherein the control device is configured to switch the isolating transmitter on and off according to the PWM signal such that the isolating transmitter is switched on only at the time of the transfer of the edges of the PWM signal.

8. The communication device according to claim 4, wherein the control device has a comparator arrangement which is configured to provide a first and a second actuation signal for the circuit arrangement based on the scalar control signal.

9. The communication device according to claim 8, wherein the comparator arrangement has a low pass filter.

10. A system, comprising a controller with an active digital input and a field device with a communication device according to claim 1, wherein the active digital input is connected to the passive digital output.

* * * * *